(12) United States Patent
Shi et al.

(10) Patent No.: US 10,667,055 B2
(45) Date of Patent: *May 26, 2020

(54) SEPARATED AUDIO ANALYSIS AND PROCESSING

(71) Applicant: Dolby Laboratories Licensing Corporation, San Francisco, CA (US)

(72) Inventors: Dong Shi, Singapore (SG); Xuejing Sun, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,654

(22) Filed: Aug. 29, 2019

(65) Prior Publication Data

US 2019/0387316 A1  Dec. 19, 2019

Related U.S. Application Data

(63) Continuation of application No. 15/577,618, filed as application No. PCT/US2016/034465 on May 26, 2016, now Pat. No. 10,405,093.

(Continued)

(30) Foreign Application Priority Data

May 28, 2015  (CN) .......................... 2015 1 02835912

(51) Int. Cl.
*G06F 3/16* (2006.01)
*H03G 3/30* (2006.01)
(Continued)

(52) U.S. Cl.
CPC ............... *H04R 3/04* (2013.01); *G06F 3/165* (2013.01); *G10L 21/02* (2013.01);
(Continued)

(58) Field of Classification Search
CPC ..... G10L 21/02; G10L 21/0232; G10L 25/18; G10L 25/48; H03G 3/3005; H03G 5/025; H03G 5/165
See application file for complete search history.

(56) References Cited

U.S. PATENT DOCUMENTS 9,633,667 B2  4/2017  Fromel
2004/0172241 A1  9/2004  Mahe
(Continued)

FOREIGN PATENT DOCUMENTS

WO  2000039926  7/2000
WO  0062280  10/2000
(Continued)

OTHER PUBLICATIONS

Bai, M. et al "Intelligent Preprocessing and Classification of Audio Signals" JAES vol. 55, Issue 5, pp. 372-384, May 2007.
(Continued)

*Primary Examiner* — Mohammad K Islam

(57) ABSTRACT

Example embodiments disclosed herein relate to separated audio analysis and processing. A system for processing an audio signal is disclosed. The system includes an audio analysis module configured to analyze an input audio signal to determine a processing parameter for the input audio signal, the input audio signal being represented in time domain. The system also includes an audio processing module configured to process the input audio signal in parallel with the audio analysis module. The audio processing module includes a time domain filter configured to filter the input audio signal to obtain an output audio signal in the time domain, and a filter controller configured to control a filter coefficient of the time domain filter based on the processing parameter determined by the audio analysis
(Continued)

module. Corresponding method and computer program product of processing an audio signal are also disclosed.

16 Claims, 6 Drawing Sheets

Related U.S. Application Data

(60) Provisional application No. 62/175,741, filed on Jun. 15, 2015.

(51) Int. Cl.
    *H03G 5/02*       (2006.01)
    *H03G 5/16*       (2006.01)
    *H04R 3/04*       (2006.01)
    *G10L 21/02*      (2013.01)
    *G10L 25/18*      (2013.01)
    *G10L 25/21*      (2013.01)
    *G10L 25/48*      (2013.01)
    *G10L 21/0232*    (2013.01)

(52) U.S. Cl.
    CPC .......... *G10L 21/0232* (2013.01); *G10L 25/18* (2013.01); *G10L 25/21* (2013.01); *G10L 25/48* (2013.01); *H03G 3/3005* (2013.01); *H03G 5/025* (2013.01); *H03G 5/165* (2013.01)

(56) References Cited

U.S. PATENT DOCUMENTS

| | | |
|---|---|---|
| 2009/0017784 A1 | 1/2009 | Dickson |
| 2009/0094023 A1 | 4/2009 | Sung |
| 2009/0299742 A1 | 12/2009 | Toman |
| 2010/0174767 A1 | 7/2010 | Villemoes |
| 2011/0064213 A1 | 3/2011 | Deng |
| 2011/0096942 A1 | 4/2011 | Thyssen |
| 2011/0173008 A1 | 7/2011 | Lecomte |
| 2012/0022676 A1* | 1/2012 | Ishikawa ................. G10L 21/04 700/94 |
| 2012/0087509 A1 | 4/2012 | Elmedyb |
| 2012/0263317 A1 | 10/2012 | Shin |
| 2013/0089228 A1 | 4/2013 | Strelcyk |
| 2013/0136266 A1* | 5/2013 | McClain ................. H03G 3/32 381/57 |
| 2013/0332498 A1 | 12/2013 | Vickers |
| 2013/0339012 A1 | 12/2013 | Kawashima |
| 2014/0146977 A1 | 5/2014 | Munk |
| 2015/0179182 A1 | 6/2015 | Vinton |
| 2015/0380002 A1 | 12/2015 | Uhle |
| 2017/0047078 A1 | 2/2017 | Wang |
| 2017/0111737 A1 | 4/2017 | Painter |

FOREIGN PATENT DOCUMENTS

| | | |
|---|---|---|
| WO | 2007095664 | 8/2007 |
| WO | 2008046468 | 4/2008 |
| WO | 2014197171 | 12/2014 |

OTHER PUBLICATIONS

Nayebi, Kambiz "A Time Domain Framework for the Analysis and Design of FIR Multirate Filter Bank Systems" Georgia Institute of Technology, 1990, Dissertations and Theses.

* cited by examiner

SEPARATED AUDIO ANALYSIS AND PROCESSING

CROSS-REFERENCE TO RELATED APPLICATIONS

This application is a continuation application of U.S. patent application Ser. No. 15/577,618 filed on Nov. 28, 2017, which is the US national phase of International Application No. PCT/US2016/034465 filed May 26, 2016, which claims the benefit of Chinese Patent Application No. 2015102835912 filed on 28 May 2015, and U.S. Provisional Patent Application No. 62/175,741, filed on Jun. 15, 2015, each of which are hereby incorporated by reference in their entirety.

TECHNOLOGY

Example embodiments disclosed herein generally relate to audio signal processing, and more specifically, to a method and system for separated audio analysis and processing of an audio signal.

BACKGROUND

In order to achieve an audio signal with good quality, it is generally necessary to process the audio signal. Such an audio signal processing task involves audio signal analysis and audio signal processing based on the analysis results to calibrate and present the audio signal (such as, playback of the audio signal). Typically the audio signal processing may include equalization processing, volume control, noise elimination, peak limiting processing, and so forth.

Audio processing systems are generally designed depending on factors such as latency, computational complexity, or signal distortion requirements. In conventional audio processing systems, an audio signal analysis and processing procedure comprises transforms between time domain and frequency domain. For example, an input audio signal is generally divided into frames by windowing. The frames are then transformed into the frequency domain so that energy, power, or spectrum characteristics of the audio signal can be analyzed at the frequency subband level. After that analysis, the audio signal transformed in the frequency domain is processed using the analysis results, and then the processed audio signal is transformed back to the time domain for playback. A plurality of filters/filterbanks can be designed for both analysis and processing purposes.

There is a tradeoff between audio processing latency, computational complexity and signal distortion. To achieve a powerful signal analysis, known approaches have to operate with high computational complexity or significant latency. More specifically, longer latency is introduced in the known approaches due to the framing of the audio signal and the use of the filterbanks that the audio signal passes through. Long latency of the audio signal processing is very likely to decrease the overall performance of the systems and has negative impacts on user experience, especially for cases that need real time processing, such as instant voice communications. On the other hand, in order to obtain perfect reconstruction (PR) of the audio signal, the filterbanks used for time-to-frequency transforming and corresponding inverse transforming are subject to additional constraints, which would potentially introduce band isolation and imperfect linear convolution issues. Most filterbank approaches used in the transforms generally process signals in a critically sampled manner (for example, signals in subbands are highly decimated) and such approaches would introduce harmonic distortions during the audio signal processing.

SUMMARY

Example embodiments disclosed herein propose a solution for processing an audio signal.

In one aspect, example embodiments disclosed herein provide a system for processing an audio signal. The system includes an audio analysis module configured to analyze an input audio signal to determine a processing parameter for the input audio signal, the input audio signal being represented in time domain. The system also includes an audio processing module configured to process the input audio signal in parallel with the audio analysis module. The audio processing module includes a time domain filter configured to filter the input audio signal to obtain an output audio signal in the time domain, and a filter controller configured to control a filter coefficient of the time domain filter based on the processing parameter determined by the audio analysis module.

In another aspect, example embodiments disclosed herein provide a method of processing an audio signal. The method includes analyzing an input audio signal to determine a processing parameter for the input audio signal, the input audio signal being represented in time domain. The method also includes filtering the input audio signal in parallel with the analyzing of the input audio signal to obtain an output audio signal in the time domain, a filter coefficient used in the filtering of the input audio signal being controlled based on the processing parameter. Embodiments in this regard further provide a corresponding computer program product.

Through the following description, it will be appreciated that in accordance with example embodiments disclosed herein, audio signal analysis and audio signal processing are performed in parallel by, for example, an audio analysis module and an audio processing module, respectively. An input audio signal is filtered in time domain without time-to-frequency transforming, which reduces processing latency as time-to-frequency transforming is avoided and therefore enables real time signal processing. The time domain filtering also supports linear convolution performance and avoids harmonic distortion in the output audio signal. On the other hand, the audio signal is analyzed in parallel with the audio signal processing. When the results of the analysis are obtained, a processing parameter can be used to assist in filtering the input audio signal. Since the resulting audio signal (during the analysis) is used for obtaining a processing parameter, (not for reconstructing an output audio signal), a filter or filterbank in the analysis module may be designed in a more flexible way to achieve better band isolation for audio analysis. The audio signal can also be analyzed in the frequency domain but it is not necessary to transform the audio signal back to time domain, which can reduce the system complexity. Other advantages achieved by example embodiments disclosed herein will become apparent through the following descriptions.

DESCRIPTION OF DRAWINGS

Through the following detailed description with reference to the accompanying drawings, the above and other objectives, features and advantages of example embodiments disclosed herein will become more comprehensible. In the drawings, several example embodiments disclosed herein will be illustrated in an example and non-limiting manner, wherein.

Throughout the drawings, the same or corresponding reference symbols refer to the same or corresponding parts.

DESCRIPTION OF EXAMPLE EMBODIMENTS

Figure 1:
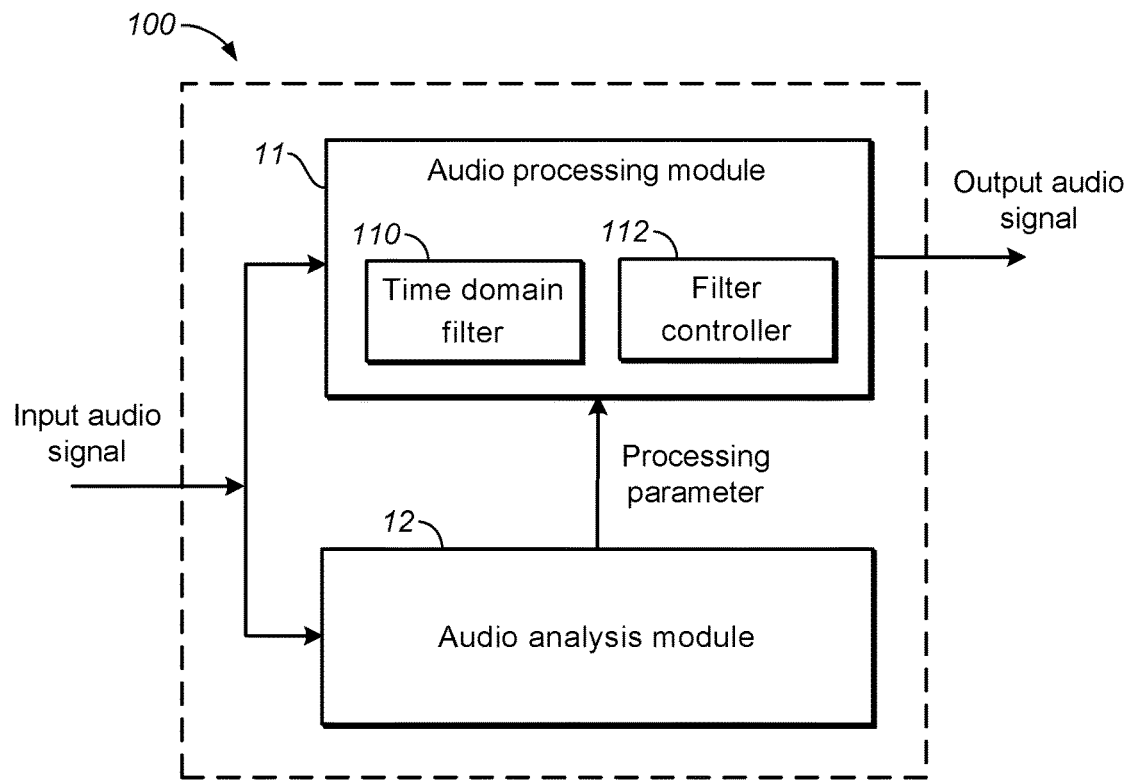
FIG. 1 is a block diagram of a system for processing an audio signal in accordance with one example embodiment disclosed herein.

Principles of example embodiments disclosed herein will now be described with reference to various example embodiments illustrated in the drawings. It should be appreciated that depiction of those embodiments is only to enable those skilled in the art to better understand and further implement example embodiments disclosed herein, not intended for limiting the scope disclosed herein in any manner.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "one example embodiment" and "an example embodiment" are to be read as "at least one example embodiment." The term "another embodiment" is to be read as "at least one other embodiment".

Generally speaking, in accordance with embodiments disclosed herein, audio signal analysis and audio signal processing are performed in parallel by, for example, an audio analysis module and an audio processing module, respectively. An input audio signal is filtered in time domain without time-to-frequency transforming, which reduces processing latency as time-to-frequency transforming is avoided and therefore enables real time signal processing. The time domain filtering also supports linear convolution performance and avoids harmonic distortion in the output audio signal. On the other hand, the audio signal is analyzed in parallel with the audio signal processing. When the results of the analysis are obtained, a processing parameter can be used to assist in filtering the input audio signal. Since the resulting audio signal (during the analysis) is used for obtaining a processing parameter, (not for reconstructing the output audio signal), a filter or filterbank in the analysis module may be designed in a more flexible way to achieve better band isolation for audio analysis. The audio signal can also be analyzed in the frequency domain but it is not necessary to transform the audio signal back to time domain, which can reduce the system complexity.

FIG. 1 is a block diagram of a system for processing an audio signal 100 in accordance with one example embodiment disclosed herein. As shown, the system 100 includes an audio processing module 11 and an audio analysis module 12. The audio processing module 11 and the audio analysis module 12 operate in parallel to perform audio signal processing and analysis tasks, respectively.

The audio analysis module 12 is configured to analyze an input audio signal to determine a processing parameter for the input audio signal in accordance with one example embodiment disclosed herein. In one example embodiment, the input audio signal may be represented in time domain. In one example embodiment, the input audio signal may be of a multichannel format. Of course, signals in any other suitable formats, such as mono signals are suitable as well. The input audio signal is analyzed in the module 12 to obtain some spectral, temporal, and/or spatial properties of the signal so as to determine a processing parameter for assisting in the audio signal processing. In some embodiments, the audio signal analysis in the module 12 may include energy, power, loudness, or spectrum characteristic analysis. Of course, it will be appreciated that the audio signal may be analyzed for any other purposes and the scope of the subject matter disclosed herein is not limited in this regard.

The determined processing parameter may be used to indicate the analysis result. By way of example, the processing parameter may indicate an equalization level, a volume level, a noise elimination level, or other processing parameters for processing of the input audio signal. In some embodiments disclosed herein, multiple processing parameters may be determined to control different aspects of the signal processing. A processing parameter may be a scalar value, a vector, or an index for indicating a processing level among several predefined levels. The scope of the subject matter disclosed herein is not limited in this regard. The processing parameter is passed into the audio processing module 11 for using.

In accordance with one example embodiment disclosed herein, the audio processing module 11 is configured to process the input audio signal in parallel with the audio analysis module 12. As used herein, "in parallel with" means that each of the two modules operates in its own way (for example, an optimal way of analysis or processing) without giving consideration to the procedure progress of the other module. In such a way, the audio analysis module 12 can be dedicated for audio signal analysis without constraints for reconstruction of the audio signal as signal reconstruction is a task in the audio processing module 11. The audio processing module 11 can be dedicated for audio processing with lower latency and good linear convolution. In example embodiments disclosed herein, time domain filtering can be employed in the audio processing module 11. Since the input audio signal is generally represented in time domain, there is no framing latency of the input audio signal when time-to-frequency transforming is avoided. The time domain filtering can also achieve the goal of perfect linear convolution and avoid nonlinear distortions, for example, harmonic distortions.

In some embodiments, the audio signal processing may include equalization processing, volume control, noise elimination, or peak limiting processing. Of course, it will be appreciated that the audio signal may be processed for any other purposes and the scope of the subject matter disclosed herein is not limited in this regard.

As shown in FIG. 1, the audio processing module 11 includes a time domain filter 110 and a filter controller 112. The time domain filter 110 is configured to filter the input audio signal to obtain an output audio signal in the time domain in accordance with one example embodiment disclosed herein. The time domain filter 110 may process the input audio signal in time domain for any predefined purposes. Since the input audio signal is generally in a time domain representation, a time-to-frequency transforming is avoided in the audio processing module 11, which can significantly reduce the processing latency. The use of a time domain filter may also improve liner convolution performance, thereby reducing signal distortions and achieving perfect reconstruction of the audio signal. On the other hand, the computational complexity can be potentially reduced as the time domain filtering generally relates to operations such as multiplications and additions. This also makes the audio processing module suitable to be, for example implemented by modern digital signal processors (DSPs) as operations of multiplications and additions can be efficiently realized using DSPs. It will be appreciated that any other kinds of processors may also be employed such, for example, as general purpose processors and the like as described below with reference to FIG. 10. The scope of the subject matter disclosed herein is not limited in this regard.

In some embodiments disclosed herein, the time domain filter 110 may be designed dependent on the type of processing. For example, the time domain filter 110 may be a time domain equalization filter used to perform equalization of the input audio signal, or a time domain volume leveling filter used to control a volume of the signal. The time domain filter 110 may include one filter, one filterbank, or multiple filterbanks according to the processing requirements. In some embodiments disclosed herein, multiple different time domain filters 110 may be included in the audio processing module 11 to achieve different processing intents. The time domain filter 110 may be designed to be a low pass filter, a high pass filter, a band pass filter, a band rejection filter, or a notch filter. It will be appreciated that any other kinds of filters may also be employed as required. The scope of the subject matter disclosed herein is not limited in this regard.

In accordance with one example embodiment disclosed herein, the filter controller 112 included in the audio processing module 11 is configured to control a filter coefficient of the time domain filter 110 based on the processing parameter determined by the audio analysis module 12. In this case, the time domain filter 110 may be a variable filter, the filter coefficient (or frequency response) of which is controlled by the processing parameter. In some embodiments, a time domain filter may have multiple filter coefficients to be controlled. One, some, or all of the filter coefficients may be determined based on the processing parameter.

As mentioned above, the audio processing module 11 and the audio analysis module 12 operate in parallel with each other. The audio processing module 11 may aim for real time processing in some use cases. On the contrary, the audio analysis module 12 is dedicated for audio analysis which may introduce longer latency compared with that of the audio processing module 11. In some embodiments, the filter controller 112 may not necessarily control the filter coefficients of the time domain filter 110 in real time. Whenever the processing parameter is provided from the audio analysis module 12, the filter coefficients are updated accordingly.

Figure 2:
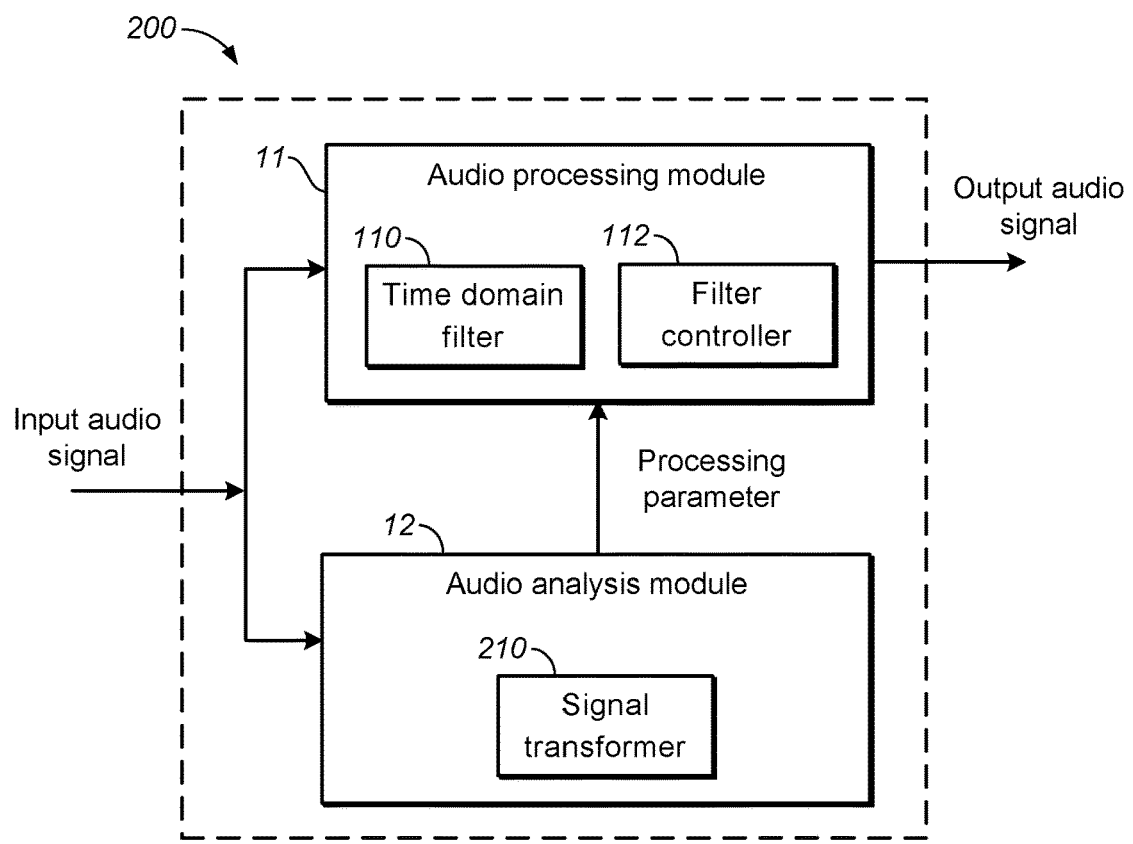
FIG. 2 is a block diagram of a system for processing an audio signal in accordance with another example embodiment disclosed herein.

In accordance with embodiments disclosed herein, the system 100 may have a variety of implementations or variations to achieve the optimal processing or analysis performance and/or to satisfy different use cases. In order to achieve flexible and powerful audio analysis, in some embodiments, the input audio signal may be transformed to frequency domain in the audio analysis module 12 for subband level analysis. FIG. 2 shows a block diagram of such a system 200, which can be considered as an implementation of the system 100 described above.

As shown, in the system 200, the audio analysis module 12 includes a signal transformer 210. The signal transformer 210 is configured to transform the input audio signal from the time domain to frequency domain. For example, the input audio signal may be divided into frames by using windows. The frames are then transformed into the frequency domain to obtain multiple frequency subband coefficients for multiple defined frequency subbands. As a result, energy, power, loudness, or spectrum characteristics of the audio signal can be analyzed at the frequency subband level. The transformed audio signal may be analyzed in frequency domain, which allows more reliable analysis results.

In some example embodiments disclosed herein, multiple processing parameters for multiple frequency subbands of the input audio signal may be determined, so that the module 11 may perform finer audio processing on respective frequency subbands. For example, multiple processing parameters indicating multiple equalization levels for different frequency subbands may be determined. The audio processing module 11 may perform equalization on different frequency subbands based on the respective equalization levels.

In some example embodiments disclosed herein, one filter, a filterbank, or multiple filterbanks may be designed for performing the time-to-frequency transforming and audio analysis. The transforming may include, but is not limit to, complex quadrature mirror filterbanks (CQMF), Fast Fourier Transform (FFT), or discrete Fourier Transform (DFT). The scope of the subject matter disclosed herein is not limited in this regard.

It will be appreciated that an inverse transforming, such as a frequency-to-time transforming is avoided in the audio analysis module 12 or even in the system 200 since the input audio signal is transformed to frequency domain merely for analysis. In the branch of audio processing (for example, in the audio processing module 11), the input audio signal is always processed in time domain. In this way, the system complexity may be reduced. On the other hand, since the audio analysis module 12 is dedicated only for audio analysis, not for reconstructing an output audio signal, constraints for perfect reconstruction of the audio signal may be relaxed when designing the filter/filterbank for transforming or analyzing in the audio analysis module 12. By eliminating the perfect reconstruction constraints, much better transforming properties such as band isolation can be expected, which may further improve the analysis results.

In general, time-to-frequency transforming may introduce longer latency proportional to the frame size. If the audio analysis module 12 is dedicated for accurate analysis to obtain more reliable results, the latency may also be increased. On the contrary, the audio signal can be processed in the audio processing module 11 with lower latency. As a result, there may be delay difference between the audio analysis module 12 and the audio processing module 11. In this case, the processing parameter may not be prepared for audio processing in time.

For some applications that require real-time audio processing and output, such as instant voice communication, the time domain filter 110 in the module 11 may filter a portion of the input audio signal (also referred to as a "first portion" hereinafter, which may be the starting portion of the audio signal) in some example embodiments, without waiting for the processing parameter. The filter coefficients of the time domain filter 110 used in filtering the first portion may have a default set of coefficients in this case. Alternatively, the filter coefficients determined in the previous operations may be used. After a period of time, the audio analysis module 12 may determine and provide the new processing parameter to the filter controller 112 in the module 11. The filter controller 112 may update the filter coefficients based on the determined processing parameter to obtain updated filter coefficients. Then the time domain filter 110 may be able to use the updated filter coefficients to filter a subsequent portion (referred to as a "second portion" hereinafter) of the input audio signal.

Since the audio properties generally remain unchanged during a certain period of time, the processing parameter determined based on a previous portion of the audio signal may also be suitable for assisting in the processing of a subsequent portion of the audio signal. For example, in a voice processing system, it is supposed that the audio analysis module 12 transforms a speech signal into frequency domain with a frame size of 20 ms and the audio processing module 11 processes the speech signal in real time. There may be delay difference of 20 ms between the two modules if other analyzing or processing delays are omitted. The time domain filter 110 in the audio processing module 11 may filter the first portion of the speech signal during the first period of 20 ms without any processing parameter from the module 12. After the first period, a processing parameter may be provided and the filter coefficients of the time domain filter 110 may be controlled based on this parameter. The time domain filter 110 may then filter the second portion of the speech signal during the second period of 20 ms, using the updated filer coefficients.

It is noted that the provision of the processing parameter may also be delayed by a constant latency (the difference in latency between the analysis and processing modules). However, the constant latency is generally small in practice and its impact on the audio analysis procedure and the audio processing procedure is usually negligible.

Although example embodiments are described with respect to an input audio signal in a time domain representation, it will be appreciated that an original audio signal represented in frequency domain may also be analyzed and processed by adding/emitting one or more functional blocks in the systems. In some embodiments where an input audio signal is provided in frequency domain, the signal transformer 210 may be omitted in the audio analysis module 12 and the audio signal may be directly analyzed in frequency domain. Additionally, in order to perform time domain filtering, a signal transformer may be additionally included in the audio processing module 11. This signal transformer may be configured to transform the audio signal from frequency domain to time domain such that the time domain filter 110 may filter the transformed signal.

Figure 3:
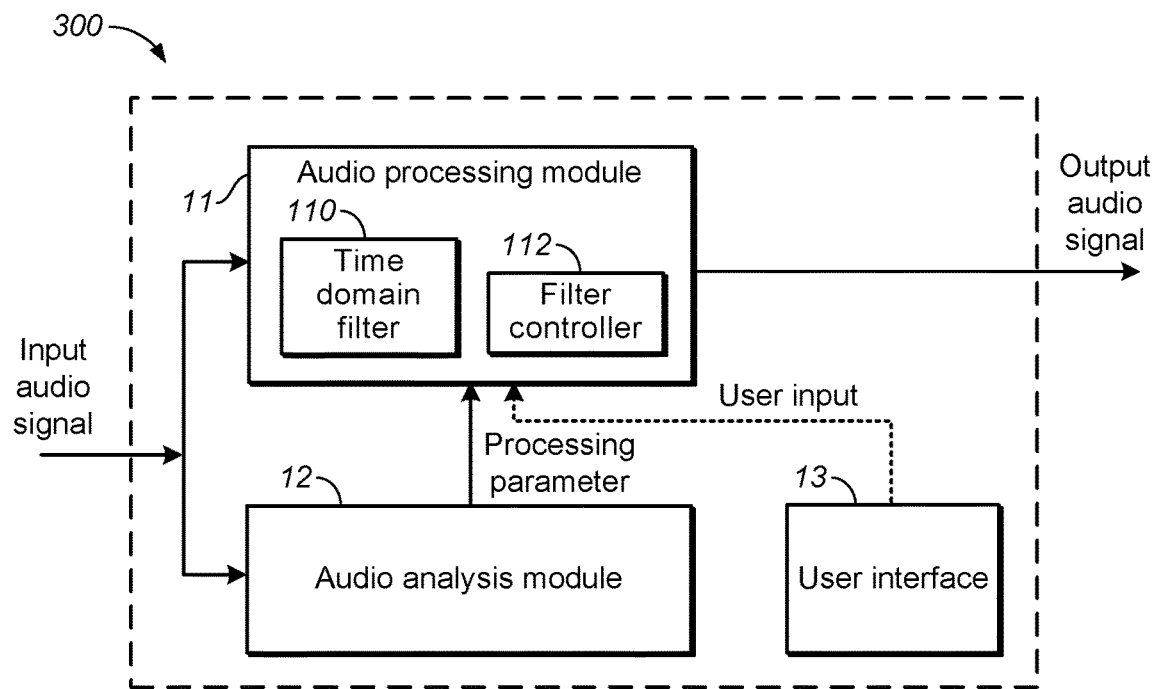
FIG. 3 is a block diagram of a system for processing an audio signal in accordance with yet another example embodiment disclosed herein.

FIG. 3 shows a block diagram of a system for processing an audio signal 300 in accordance with yet another example embodiment disclosed herein. As shown, the system 300 additionally includes a user interface 13. The user interface 13 is configured to receive user input from a user for controlling the processing of the input audio signal. Therefore, the user can anticipate in the audio analysis and processing procedure, which may improve user experience. For example, the user may desire to increase or decrease the volume of the audio signal. The user interface 13 may then receive corresponding user input from the user, indicating the desired volume level of the audio signal. It will be appreciated that the received user input may indicate any aspects of the audio processing if appropriate.

The user input is passed into the audio processing module 11. The filter controller 112 is configured to control the filter coefficients of the corresponding time domain filter based on the received user input in some embodiments disclosed herein. For example, if the user input indicates the desired volume level of the user, the filter coefficients of the time domain volume leveling filter 110 may be adjusted accordingly. In the embodiments where there is delay difference between the module 11 and the module 12, the user input may be used to determine the filter coefficients when no processing parameter is determined by the module 12.

In some other embodiments disclosed herein, the user input received by the user interface 13 may be alternatively provided to the audio analysis module 12 such that the module 12 may determine the processing parameter based on its analysis result and the user input both.

It will be appreciated that the systems 200 and 300 can be used in combination. More specifically, as shown in FIG. 3, in one example embodiment, the system 300 may include the signal transformer 210 discussed with reference to FIG. 2.

As mentioned above, the audio analysis module 12 may be configured to perform audio analysis for different purposes such as energy, power, loudness, and spectrum characteristics so as to determine processing parameters for the input audio signal. In cases where the input audio signal is expected to be equalized, the audio analysis module 12 may analyze the input audio signal to obtain a processing parameter indicating an equalization level. In cases where a volume of the input audio signal is expected to be adjusted, a processing parameter indicating a volume level may be obtained. The audio analysis module 12 may also determine other processing parameters controlling any other aspects of the audio signal processing such as noise elimination or peak limiting processing.

Figure 4:
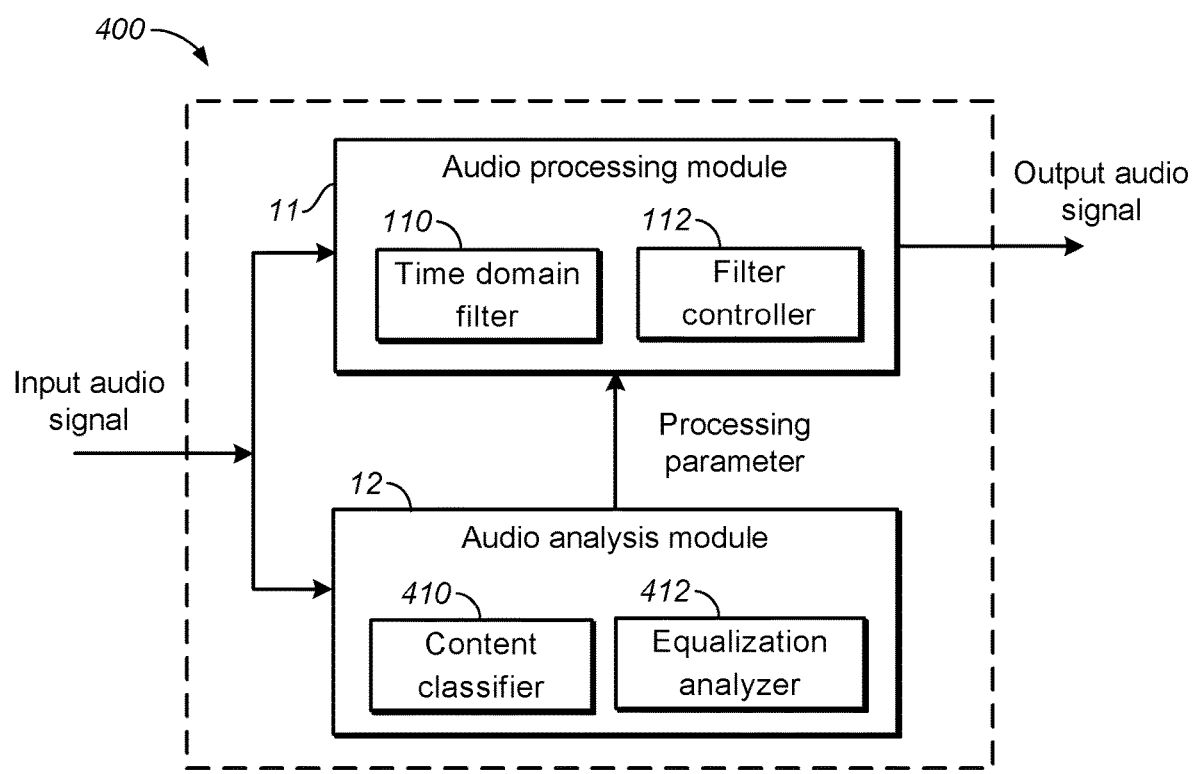
FIG. 4 is a block diagram of a system for processing an audio signal in accordance with still yet another example embodiment disclosed herein.

FIG. 4 is a block diagram of a system for processing an audio signal 400 in accordance with an example embodiment where an input audio signal is expected to be equalized. The signal equalization is applied to achieve desired boost or attenuation of some frequencies or subbands of the audio signal.

In some example embodiments disclosed herein, the audio analysis module 12 performs signal analysis based on the fact that different types of audio may need different equalizations. As shown, in the system 400, the audio analysis module 12 includes a content classifier 410 and an equalization analyzer 412. The content classifier 410 is configured to determine a content type of the input audio signal by, for example, analyzing the spectrum or temporal characteristics in frequency or time domain. The content type of the audio signal may include music, dialog, movie, background noise, and the like. In some embodiments disclosed herein, longer latency is allowed in the audio analysis module 12 to obtain a more reliable classification result.

The equalization analyzer 412 is configured to determine a processing parameter indicating an equalization level for the input audio signal based on the content type. In some embodiments, each type of the audio signal may correspond to a different equalization level.

The processing parameter indicating the equalization level may be passed to the audio processing module 11 in the system 400. The filter controller 112 included in the module 11 may be configured to control the filter coefficients of the time domain filter 110 based on the equalization level indicated by the processing parameter. The time domain filter 110 may be configured to perform equalization on the input audio signal in the time domain. With the updated filter coefficients, the frequency responses of the time domain filter 110 can be designed to make sure that the output audio signal is adjusted to the equalization level.

In some embodiments disclosed herein, the systems 200, 300, and/or 400 can be used in combination. More specifically, as shown in FIG. 4, in one example embodiment, the audio analysis module 12 may include the signal transformer 210 discussed with reference to FIG. 2. In this case, the input audio signal may be first transformed into frequency domain by the signal transformer 210 and the content classification may be performed at the frequency subband level. For example, spectrum characteristics of different subbands may be analyzed by the module 12 to determine the content type of the audio signal. An overall equalization level or multiple equalization levels for different subbands may be then determined based on the content type. In another example embodiment, the system 400 may also include the user interface 13 discussed with reference to FIG. 3.

It will be appreciated that the audio analysis module 12 may be configured to determine a processing parameter for equalization processing by many other ways. For example, the audio analysis module 12 may analysis the energies in different frequency subbands to determine an equalization level for the audio processing module 11. The scope of the subject matter disclosed herein is not limited in this regard.

Figure 5:
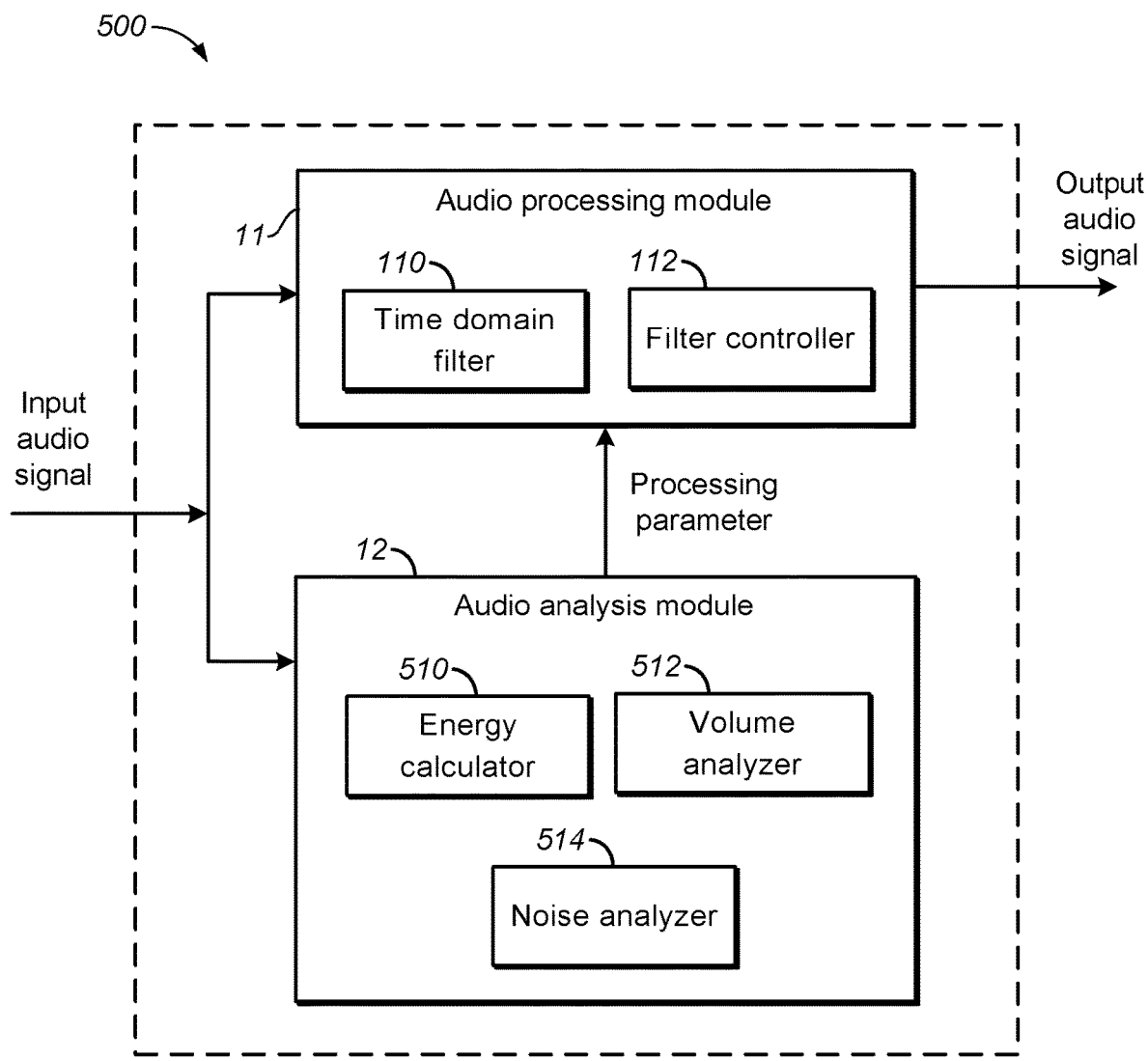
FIG. 5 is a block diagram of a system for processing an audio signal in accordance with still yet another example embodiment disclosed herein.

FIG. 5 is a block diagram of a system for processing an audio signal 500 in accordance with an example embodiment where a volume of an input audio signal is expected to be adjusted.

In some example embodiments disclosed herein, volume leveling of the input audio signal can be used to provide consistent perceptual loudness throughout different contents. As shown in FIG. 5, the audio analysis module 12 includes an energy calculator 510 and a volume analyzer 512. The module 12 is designed to track the energy/power of the input audio signal to determine an appropriate volume level for the signal.

The energy calculator 510 is configured to determine the energy or power of the input audio signal. A higher power means that the volume needs to be decreased, and a lower power means that the volume of the audio signal can be increased for better perceptual experience. In some example embodiments disclosed herein, the audio analysis module 12 in the system 500 may include the signal transformer 210 discussed with respect to FIG. 2. In this case, the input audio signal may be first transformed into frequency domain by the signal transformed 210 and the energy track be performed at the subband level.

The volume analyzer 512 is configured to determine a processing parameter indicating a volume level for the input audio signal based on the energy or power of the input audio signal. For example, a volume level may be a continuous value between −20 dB and +20 dB based on the calculated energy or power.

The processing parameter indicating the volume level may be passed into the audio processing module 11. The filter controller 112 included in the module 11 may be configured to control the filter coefficients of the time domain filter 110 based on the volume level indicated by the processing parameter. With the filter coefficients adjusted, the time domain filter 110 may be configured to control a volume of the input audio signal to the determined volume level in time domain. In some embodiments disclosed herein, the input audio signal may be processed in loudness domain in the module 11. The loudness of the audio signal may not be in a linear relationship with the volume level in some examples. The loudness levels on different perceptual subbands of the input audio signal are different and can be determined based on the volume level.

In some other embodiments disclosed herein, the audio analysis module 12 may also include a noise analyzer 514. The noise analyzer 514 is configured to determine a noise level of the input audio signal. The noise level may indicate an amount of noise contained in the input audio signal. The noise level is passed into the volume analyzer 512. The volume analyzer 512 may then determine the processing parameter indicating the volume level based on both the power of the input audio signal and the noise level, which may improve robustness of the system. If the noise analyzer 514 determines that the input audio signal is mostly noise (for example, the noise level is higher than a threshold), the volume of the signal may not necessarily be increased or even may be decreased. As such, the noise that appears in the input audio signal may not be amplified.

In some embodiments disclosed herein, the systems 200, 300, 400, and/or 500 can be used in combination. More specifically, as mentioned above, in one example embodiment, the audio analysis module 12 in the system 500 may include the signal transformer 210 discussed with reference to FIG. 2. In another example embodiment, the system 500 may also include the user interface 13 discussed with reference to FIG. 3. In embodiments where equalization and volume leveling are both performed on the input audio signal, the audio analysis module 12 in the system 500 may also include the content classifier 410 and the equalization analyzer 412 discussed with reference to FIG. 4.

It will be appreciated that one or more functional blocks included in the system 500 may be omitted. For example, the noise analyzer 514 may be omitted in some use cases, for example, in those cases where audio signals having less possibility to contain noise (such as music or movies) are processed.

It will also be appreciated that equalization and volume leveling in the systems 400 and 500 are discussed only for the purpose of illustration, without suggesting any limitation as to the scope of the subject matter disclosed herein. The input audio signal may also be processed to achieve any other intents, such as noise elimination or peak limiting processing. The processing parameter may be determined to indicate any other processing levels to the audio processing module 11. The audio analysis module 12 and the audio processing module 11 may be configured to achieve these processing intents.

As discussed above, a processing parameter may indicate an equalization level, a volume level, or the like. The processing parameter may then be a continuous scalar value or a vector. For example, a processing parameter may be determined as a scalar value indicating the target volume of the input audio signal. In another example, a processing parameter may be a vector with multiple elements, each indicating an equalization level or a volume level for a respective frequency subband of the audio signal.

The audio processing module 11, such as the filter controller 112 in the module 11 may use a mapping function to map the processing parameter(s) to the filter coefficients of the time domain filter 110 in a linear or nonlinear way. In embodiments where the time domain filter 110 is a filterbank, the processing parameter(s) may be mapped to a set of filter coefficients. The mapping function may be determined by taking the transitional behavior, complexity, convergence speed, and/or optimization criteria of the time domain filter 110 into account.

Figure 6:
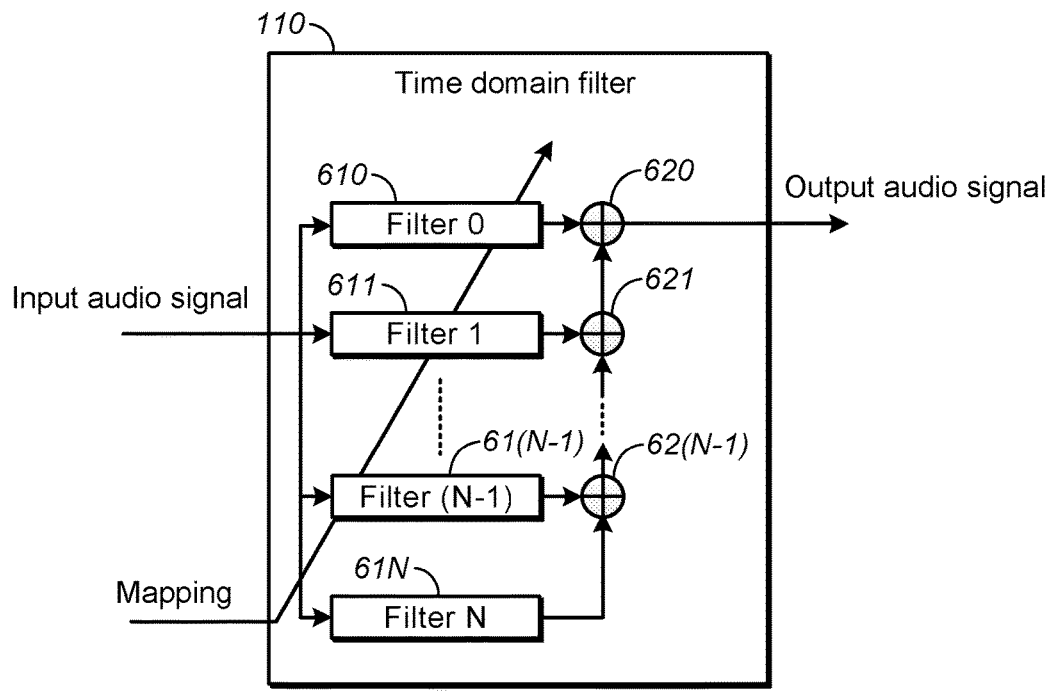
FIG. 6 is a block diagram of a time domain filter in accordance with one example embodiment disclosed herein.

FIG. 6 shows a block diagram of a time domain filter 110 in accordance with one example embodiment disclosed herein. As shown, the time domain filter 110 is a filterbank including N+1 base filters, Filter 0 to Filter N (610 to 61N). The N+1 base filters are also time domain filters, and N is larger than or equal to 0. The outputs of respective base filters are added by adders 620 to 62(N−1) to obtain the output audio signal. Based on a processing intent of the audio processing module 11 as well as the processing parameter(s) received from the audio analysis module 12, the filter coefficients of Filters 0 to N may be adjusted by the filter controller 112 accordingly. A linear or nonlinear mapping between the processing parameter(s) and the filter coefficients may be determined by the filter controller 112 and applied to respective filters to change their frequency responses.

It will be appreciated that the mapping function can be determined in many methods and the scope of the subject matter disclosed herein is not limited in this regard.

Figure 7:
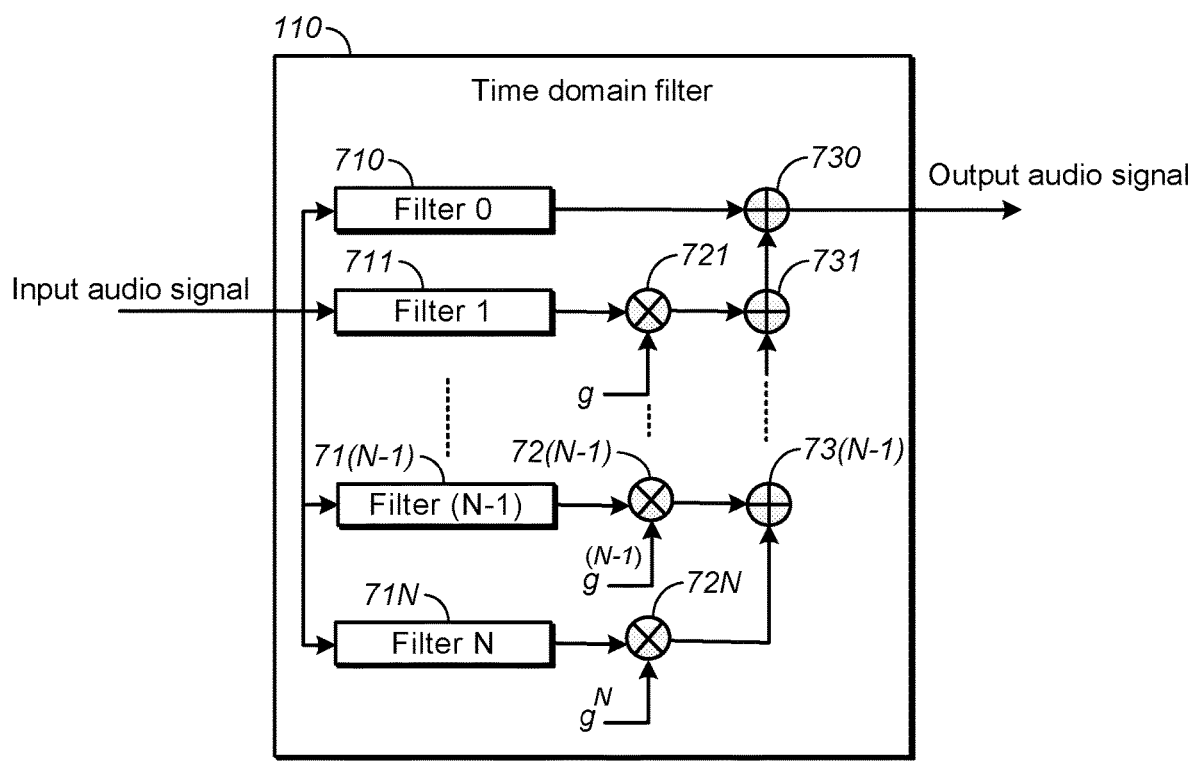
FIG. 7 is a block diagram of a time domain filter in accordance with another example embodiment disclosed herein.

In another example embodiment, the variable time domain filter may also be designed using a polynomial interpolation method to achieve the variability. FIG. 7 shows a block diagram of a time domain filter 110 in such an embodiment. In this embodiment, the processing parameter may generally be a single scalar value. For example, the process parameter may be a specific scalar value indicating a target volume of the audio signal.

As shown in FIG. 7, the time domain filter 110 is a filterbank including N+1 base filters, Filter 0 to Filter N (710 to 71N). The N+1 base filters are also time domain filters, and N is larger than or equal to 0. The outputs of respective filters are multiplied with the processing parameter g and its power versions (for example, $g^2, \ldots, g^{N-1}, g^N$) by multiplexers 721 to 72N. The outputs from the multiplexers are then summed up by adders 730 to 73(N−1) to form the output audio signal. The filter coefficients of the base filters 710 to 71N may be determined in advance according to the range of the required frequency responses (for example, loudness curves when the time domain filter 110 aims for volume levelling). The output of the audio signal may be processed to achieve, for example, volume control.

It will be appreciated that configurations of the time domain filter 110 in FIGS. 6 and 7 are discussed only for the purpose of illustration, without suggesting any limitation as to the scope of the subject matter disclosed herein. When the target of the frequency response of the time domain filter 110 (for example, the processing parameter) is determined, many methods may be employed to configure an appropriate time domain filter. It will also be appreciated that the time domain filter 110 discussed with reference to FIGS. 6 and 7 may be combined in any of the systems 100 to 500 discussed above as well as the system 800 described below.

Figure 8:
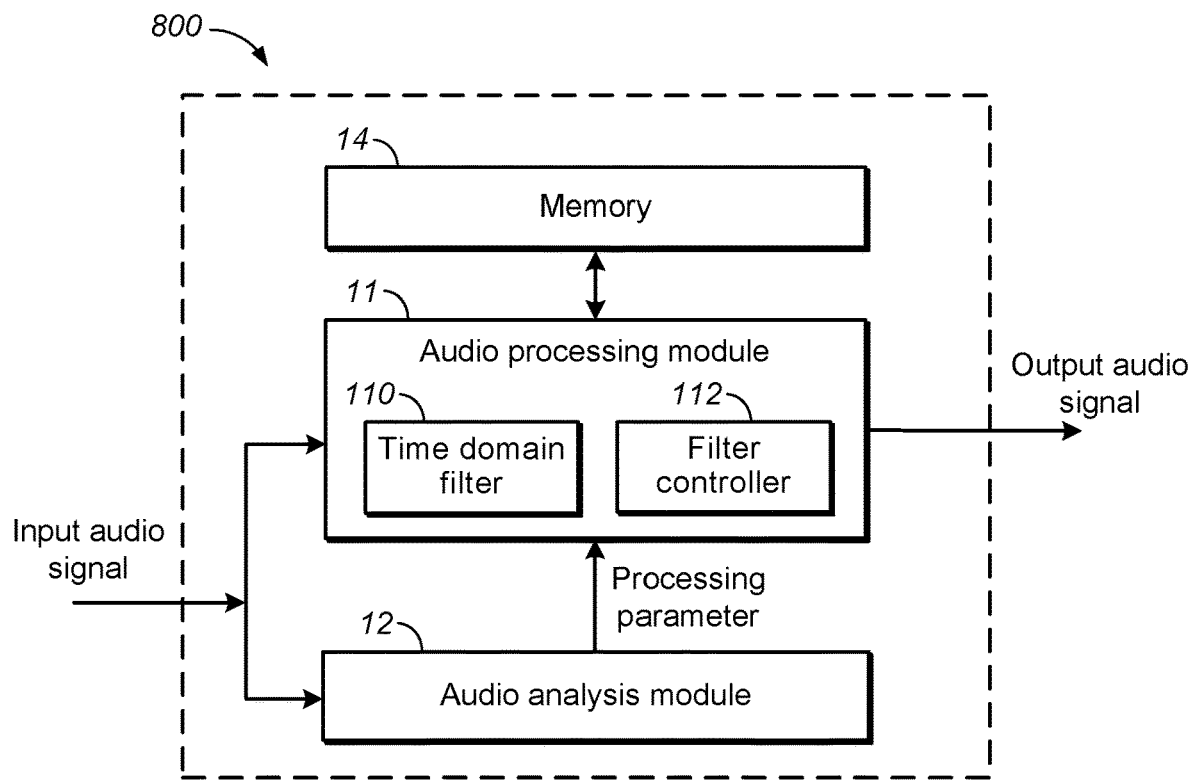
FIG. 8 is a block diagram of a system for processing an audio signal in accordance with still yet another example embodiment disclosed herein.

In a further embodiment disclosed herein, instead of explicitly indicating a processing level such as an equalization level, or a volume level, an index may be determined by the audio analysis module 12 to indicate a processing parameter among multiple different predetermined processing parameters. FIG. 8 shows a block diagram of a system for processing an audio signal 800 in accordance with such an embodiment.

As shown, the system 800 additionally includes a memory 14. The memory 14 is configured to store a plurality of predefined time domain filters, each of the time domain filters being adapted to a different processing parameter. In this case, the time domain filters corresponding to different processing parameters, such as different equalization levels or volume levels are pre-defined and stored in the memory 14. In some embodiments disclosed herein, the audio processing module 11, such as the filter controller 112 in the module 11 is configured to select a time domain filter from the plurality of predefined time domain filters based on the processing parameter.

In some embodiments disclosed herein, the processing parameters may be indexed by different identifiers and the identifiers may be shared between the modules 11 and 12. When the audio analysis module 12 analyzes the input audio signal to determine a certain processing parameter, an index corresponding to this processing parameter may be provided to the audio processing module 11. The module 11, such as the filter controller 112 in the module 11 may be configured to select the time domain filter from the plurality of predefined time domain filters based on the index. Since the time domain filters are pre-trained for selection, the processing latency in the audio processing module 11 is further reduced in this way.

It will be appreciated that the memory 14 discussed with reference to FIG. 8 may be combined in any of the systems 100 to 500 discussed above.

It is to be understood that the systems 200, 300, 400, 500, and 800 are some example modifications or variations of the system 100. The systems 200, 300, 400, 500, and 800 are discussed only for the purpose of illustration, without suggesting any limitation as to the scope disclosed herein.

It is also to be understood that the components of any of the systems 100 to 500 and the system 800 may be a hardware module or a software unit module. For example, in some embodiments, any of the systems may be implemented partially or completely as software and/or in firmware, for example, implemented as a computer program product embodied in a computer readable medium. Alternatively or additionally, any of the systems may be implemented partially or completely based on hardware, for example, as an integrated circuit (IC), an application-specific integrated circuit (ASIC), a system on chip (SOC), a field programmable gate array (FPGA), and so forth. The scope of the subject matter disclosed herein is not limited in this regard.

Figure 9:
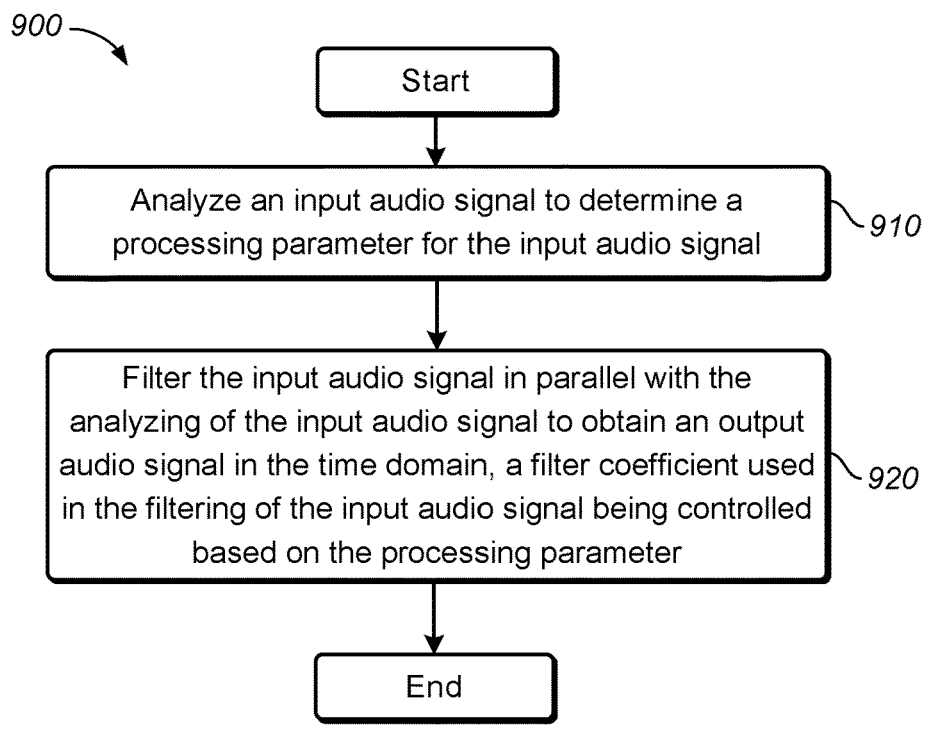
FIG. 9 is a flowchart of a method of processing an audio signal in accordance with one example embodiment disclosed herein.

FIG. 9 shows a flowchart of a method of processing an audio signal 900 in accordance with one example embodiment disclosed herein. The method 900 is entered at step 910, where an input audio signal is analyzed to determine a processing parameter for the input audio signal. In some example embodiments disclosed herein, the input audio signal may be represented in time domain. At step 920, the input audio signal is processed in parallel with the analyzing of the input audio signal to obtain an output audio signal in the time domain. In some example embodiment disclosed herein, a filter coefficient used in the filtering of the input audio signal may be controlled based on the processing parameter. In the method 900, the analysis step 910 and the processing step 920 may be performed in parallel, which means that it may not be necessary to wait for the processing parameter to start the processing step 920.

In some example embodiments disclosed herein, a first portion of the input audio signal may be filtered in the time domain using a first filter coefficient in response to no processing parameter being determined and a second portion of the input audio signal in the time domain using a second filter coefficient may be filtered in response to a processing parameter being determined. In those embodiments, the second filter coefficient may be obtained by updating the first filter coefficient based on the determined processing parameter.

In some example embodiments disclosed herein, the input audio signal may be transformed from the time domain to frequency domain. Then the input audio signal may be analyzed in the frequency domain to determine a processing parameter for the input audio signal. In those embodiments, the processing parameter may include multiple processing parameters for multiple frequency subbands of the input audio signal.

In some example embodiments disclosed herein, user input may be received for controlling the processing of the input audio signal. The filter coefficient used in the filtering may then be controlled further based on the received user input.

In some example embodiments disclosed herein, the filtering may be performed by a time domain filter. In some example embodiments disclosed herein, a plurality of predefined time domain filters may be pre-stored, each of the predefined time domain filters being adapted to a different processing parameter. In those embodiments, the time domain filter used for filtering may be selected from the plurality of predefined time domain filters based on the determined processing parameter.

In some example embodiments where equalization is performed, a content type of the input audio signal may be determined and then a processing parameter indicating an equalization level for the input audio signal may be determined based on the content type. In those embodiments, when filtering the input audio signal, equalization may be performed on the input audio signal in the time domain. The filter coefficient used in the filtering may be controlled based on the equalization level indicated by the processing parameter.

In some example embodiments where volume leveling is performed, energy of the input audio signal may be determined and then a processing parameter indicating a volume level for the input audio signal may be determined based on the energy of the input audio signal. In those embodiments, when filtering the input audio signal, a volume of the input audio signal may be controlled in the time domain. The filter coefficient used in the filtering may be controlled based on the volume level indicated by the processing parameter.

In some further embodiments disclosed herein, a noise level of the input audio signal may be determined. The noise level may indicate an amount of noise contained in the input audio signal. In those embodiments, the processing parameter indicating the volume level may be determined further based on the noise level.

Figure 10:
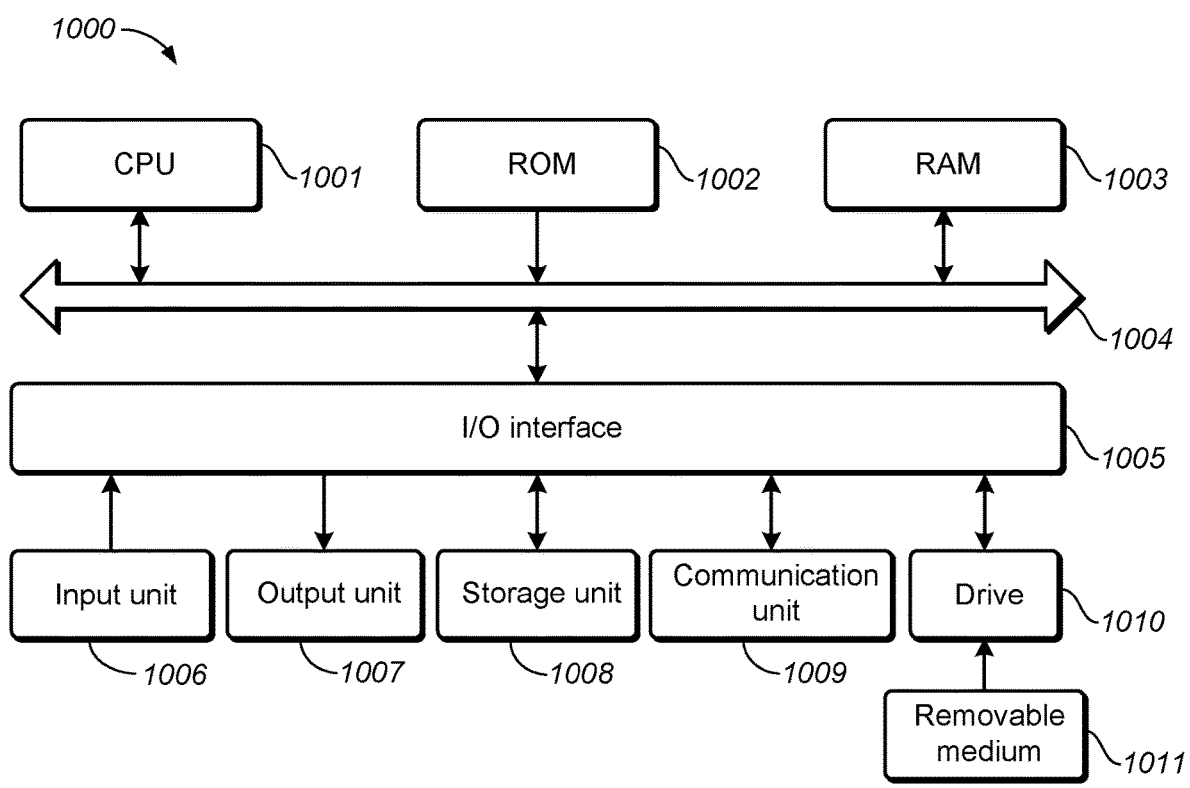
FIG. 10 is a block diagram of an example computer system suitable for implementing example embodiments disclosed herein.

FIG. 10 depicts a block diagram of an example computer system 1000 suitable for implementing example embodiments disclosed herein. As depicted, the computer system 1000 comprises a central processing unit (CPU) 1001 which is capable of performing various processes in accordance with a program stored in a read only memory (ROM) 1002 or a program loaded from a storage unit 1008 to a random access memory (RAM) 1003. In the RAM 1003, data required when the CPU 1001 performs the various processes or the like is also stored as required. The CPU 1001, the ROM 1002 and the RAM 1003 are connected to one another via a bus 1004. An input/output (I/O) interface 1005 is also connected to the bus 1004.

The following components are connected to the I/O interface 1005: an input unit 1006 including a keyboard, a mouse, or the like; an output unit 1007 including a display such as a cathode ray tube (CRT), a liquid crystal display (LCD), or the like, and a loudspeaker or the like; the storage unit 1008 including a hard disk or the like; and a communication unit 1009 including a network interface card such as a LAN card, a modem, or the like. The communication unit 1009 performs a communication process via the network such as the internet. A drive 1010 is also connected to the I/O interface 1005 as required. A removable medium 1011, such as a magnetic disk, an optical disk, a magneto-optical disk, a semiconductor memory, or the like, is mounted on the drive 1010 as required, so that a computer program read therefrom is installed into the storage unit 1008 as required.

Specifically, in accordance with example embodiments disclosed herein, the method described above with reference to FIG. 9 may be implemented as computer software programs. For example, example embodiments disclosed herein comprise a computer program product including a computer program tangibly embodied on a machine readable medium, the computer program including program code for performing the method 900. In such embodiments, the computer program may be downloaded and mounted from the network via the communication unit 1009, and/or installed from the removable medium 1011.

Generally speaking, various example embodiments disclosed herein may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example embodiments disclosed herein are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, example embodiments disclosed herein include a computer program product comprising a computer program tangibly embodied on a machine readable medium, the computer program containing program codes configured to carry out the methods as described above.

In the context of the disclosure, a machine readable medium may be any tangible medium that can contain, or store a program for use by or in connection with an instruction execution system, apparatus, or device. The machine readable medium may be a machine readable signal medium or a machine readable storage medium. A machine readable medium may include, but not limited to, an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Computer program code for carrying out methods disclosed herein may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server. The program code may be distributed on specially-programmed devices which may be generally referred to herein as "modules". Software component portions of the modules may be written in any computer language and may be a portion of a monolithic code base, or may be developed in more discrete code portions, such as is typical in object-oriented computer languages. In addition, the modules may be distributed across a plurality of computer platforms, servers, terminals, mobile devices and the like. A given module may even be implemented such that the described functions are performed by separate processors and/or computing hardware platforms.

As used in this application, the term "circuitry" refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. Further, it is well known to the skilled person that communication media typically embodies computer readable instructions, data structures, program modules or other data in a modulated data signal such as a carrier wave or other transport mechanism and includes any information delivery media.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter disclosed herein or of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination.

Various modifications, adaptations to the foregoing example embodiments disclosed herein may become apparent to those skilled in the relevant arts in view of the foregoing description, when read in conjunction with the accompanying drawings. Any and all modifications will still fall within the scope of the non-limiting and example embodiments disclosed herein. Furthermore, other embodiments disclosed herein will come to mind to one skilled in the art to which those embodiments pertain having the benefit of the teachings presented in the foregoing descriptions and the drawings.

It will be appreciated that the embodiments of the subject matter disclosed herein are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A system for processing an audio signal, comprising:
   an audio analysis module configured to analyze an input audio signal to determine a processing parameter for the input audio signal, the input audio signal being represented in time domain; and
   an audio processing module configured to process the input audio signal in parallel with the audio analysis module, the audio processing module including:
     a time domain filter configured to filter the input audio signal to obtain an output audio signal in the time domain, and
     a filter controller configured to control a filter coefficient of the time domain filter based on the processing parameter determined by the audio analysis module,
   wherein the time domain filter is configured to:
   in response to no processing parameter being determined by the audio analysis module, filter a first portion of the input audio signal in the time domain using a first filter coefficient; and
   in response to a processing parameter being determined by the audio analysis module, filter a second portion of the input audio signal in the time domain using a second filter coefficient, the second filter coefficient being obtained by updating the first filter coefficient based on the determined processing parameter.

2. The system according to claim 1, wherein the audio analysis module further includes a signal transformer configured to transform the input audio signal from the time domain to frequency domain and analyze the input audio signal in the frequency domain.

3. The system according to claim 1, further comprising:
   a user interface configured to receive user input for controlling the processing of the input audio signal, and
   wherein the filter controller is configured to control the filter coefficient of the time domain filter further based on the received user input.

4. The system according to claim 1, wherein the system further comprises a memory configured to store a plurality of predefined time domain filters, each of the predefined time domain filters being adapted to a different processing parameter, and
   wherein the filter controller is configured to select the time domain filter from the plurality of predefined time domain filters based on the processing parameter.

5. The system according to claim 1, wherein the audio analysis module includes:

a content classifier configured to determine a content type of the input audio signal; and an equalization analyzer configured to determine a processing parameter indicating an equalization level for the input audio signal based on the content type, and wherein the time domain filter is configured to perform equalization on the input audio signal in the time domain, and wherein the filter controller is configured to control the filter coefficient of the time domain filter based on the equalization level indicated by the processing parameter.

6. The system according to claim 1, wherein the audio analysis module includes:

an energy calculator configured to determine energy of the input audio signal; and a volume analyzer configured to determine a processing parameter indicating a volume level for the input audio signal based on the energy of the input audio signal, and wherein the time domain filter is configured to control a volume of the input audio signal in the time domain, and wherein the filter controller is configured to control the filter coefficient of the time domain filter based on the volume level indicated by the processing parameter.

7. The system according to claim 6, wherein the audio analysis module further includes a noise analyzer configured to determine a noise level of the input audio signal, the noise level indicating an amount of noise contained in the input audio signal, and wherein the volume analyzer is configured to determine the processing parameter indicating the volume level further based on the noise level.

8. A method of processing an audio signal, comprising:

analyzing an input audio signal to determine a processing parameter for the input audio signal, the input audio signal being represented in time domain; and filtering the input audio signal in parallel with the analyzing of the input audio signal to obtain an output audio signal in the time domain, a filter coefficient used in the filtering of the input audio signal being controlled based on the processing parameter, wherein filtering the input audio signal comprises:

in response to no processing parameter being determined, filter a first portion of the input audio signal in the time domain using a first filter coefficient; and in response to a processing parameter being determined, filter a second portion of the input audio signal in the time domain using a second filter coefficient, the second filter coefficient being obtained by updating the first filter coefficient based on the determined processing parameter.

9. The method according to claim 8, wherein analyzing an input audio signal to determine a processing parameter for the input audio signal comprises:

transforming the input audio signal from the time domain to frequency domain; and analyzing the input audio signal in the frequency domain to determine a processing parameter for the input audio signal.

10. The method according to claim 9, wherein the processing parameter includes multiple processing parameters for multiple frequency subbands of the input audio signal.

11. The method according to claim 8, further comprising:

receiving user input for controlling the processing of the input audio signal, and wherein the filter coefficient is controlled further based on the received user input.

12. The method according to claim 8, wherein the filtering is performed by a time domain filter, and wherein a plurality of predefined time domain filters are pre-stored, each of the predefined time domain filters being adapted to a different processing parameter, and wherein the method further comprises selecting the time domain filter from the plurality of predefined time domain filters based on the processing parameter.

13. The method according to claim 8, wherein analyzing an input audio signal to determine a processing parameter for the input audio signal comprises:

determining a content type of the input audio signal; and determining a processing parameter indicating an equalization level for the input audio signal based on the content type, and wherein filtering the input audio signal in time domain comprises performing equalization on the input audio signal in the time domain, and wherein the filter coefficient is controlled based on the equalization level indicated by the processing parameter.

14. The method according to claim 8, wherein analyzing an input audio signal to determine a processing parameter for the input audio signal comprises:

determining energy of the input audio signal; and determining a processing parameter indicating a volume level for the input audio signal based on the energy of the input audio signal, and wherein filtering the input audio signal in time domain comprises controlling a volume of the input audio signal in the time domain, and wherein the filter coefficient is controlled based on the volume level indicated by the processing parameter.

15. The method according to claim 14, further comprising:

determining a noise level of the input audio signal, the noise level indicating an amount of noise contained in the input audio signal; and determining the processing parameter indicating the volume level further based on the noise level.

16. A computer program product of processing an audio signal, comprising a computer program tangibly embodied on a non-transitory machine readable medium, the computer program containing program code for performing the method according to claim 8.

* * * * *